(12) United States Patent
Drazenovic

(10) Patent No.: US 9,115,030 B2
(45) Date of Patent: Aug. 25, 2015

(54) SEMICONDUCTOR CERAMIC

(76) Inventor: Béatrice Drazenovic, Marseilles (FR)

( * ) Notice: Subject to any disclaimer, the term of this patent is extended or adjusted under 35 U.S.C. 154(b) by 1176 days.

(21) Appl. No.: 13/057,830

(22) PCT Filed: Aug. 7, 2009

(86) PCT No.: PCT/FR2009/051573
§ 371 (c)(1),
(2), (4) Date: Mar. 23, 2011

(87) PCT Pub. No.: WO2010/015789
PCT Pub. Date: Feb. 11, 2010

(65) Prior Publication Data
US 2011/0169396 A1   Jul. 14, 2011

(30) Foreign Application Priority Data

Aug. 8, 2008  (FR) ...................................... 08 55483

(51) Int. Cl.
| | |
|---|---|
| H01T 13/20 | (2006.01) |
| H01B 1/00 | (2006.01) |
| C04B 35/117 | (2006.01) |
| C04B 35/645 | (2006.01) |
| H01L 23/15 | (2006.01) |
| C04B 35/185 | (2006.01) |
| C04B 35/584 | (2006.01) |
| C04B 35/597 | (2006.01) |
| H01B 3/12 | (2006.01) |
| H01L 23/14 | (2006.01) |
| H01B 3/00 | (2006.01) |
| H01B 3/20 | (2006.01) |
| H01T 13/38 | (2006.01) |
| H01B 3/02 | (2006.01) |

(52) U.S. Cl.
CPC ............ C04B 35/117 (2013.01); C04B 35/185 (2013.01); C04B 35/584 (2013.01); C04B 35/597 (2013.01); C04B 35/645 (2013.01); C04B 2235/3227 (2013.01); C04B 2235/3804 (2013.01); C04B 2235/3891 (2013.01); C04B 2235/422 (2013.01); C04B 2235/5436 (2013.01); C04B 2235/5445 (2013.01); C04B 2235/5454 (2013.01); C04B 2235/5472 (2013.01); C04B 2235/666 (2013.01); C04B 2235/77 (2013.01); H01B 1/00 (2013.01); H01B 3/00 (2013.01); H01B 3/02 (2013.01); H01B 3/12 (2013.01); H01B 3/20 (2013.01); H01L 23/147 (2013.01); H01L 23/15 (2013.01); H01T 13/20 (2013.01); H01T 13/38 (2013.01)

(58) Field of Classification Search
None
See application file for complete search history.

(56) References Cited

U.S. PATENT DOCUMENTS 5,085,804 A    2/1992 Washburn

FOREIGN PATENT DOCUMENTS

| EP | 0 180 928 A | 5/1986 | |
|---|---|---|---|
| WO | WO 9108992 A1 * | 6/1991 | .............. C04B 35/52 |
| WO | WO 97/34444 A | 9/1997 | |

OTHER PUBLICATIONS

Skorokhod et al. Processing, Microstructure, and Mechanical Properties of B4C-TiB2 Particulate Sintered Composites. Powder Metallurgy and Metal Ceramics, vol. 39, Nos. 7-8, 2000.*
International Search Report as issued for PCT/FR2009/051573, dated Feb. 4, 2010.
Kimura et al.; "Sintering and characterization of Al2O3-TiB2 composites"; Journal of European Ceramic Society, Elsevier Science Publishers, Barking, Essex, Great Britain, vol. 5, No. 1, Jan. 1, 1989; pp. 23-27.
Stadlbauer et al.; "AL2O3-TiB2 Composite Ceramics" Journal of Material Science Letters, Chapman and Hall Ltd. London, Great Britain, vol. 8, No. 10, Oct. 1, 1989; pp. 1217-1220.
Matsushita et al.; "Pressureless sintering of TiB2Al2O3", Nippon Seramikkusu Kyokai Gakujutsu Rombushi—Journal of the Ceramic Society of Japan, Nippon Seramikkusu Kyokai, Tokyo, Japan, vol. 97, No. 10, Jan. 1, 1989, pp. 1200-1205.
Ray; "Boride-alumina composites: synthesis and fabrication", Metallurgical Transactions A—Physical Metallurgy and Materials Science, Springer New York LLC, United States, vol. 23A, No. 9, Sep. 1, 1992, pp. 2381-2385.

* cited by examiner

*Primary Examiner* — Tanisha Diggs
(74) *Attorney, Agent, or Firm* — Pillsbury Winthrop Shaw Pittman LLP

(57) ABSTRACT

A semiconductor ceramic including a microstructure including 5 to 40% by volume of a particulate conducting phase, and 60 to 95% by volume of a particulate insulating phase, a size of the particles of the conducting phase being between 5 nm and 11 μm, 65 to 80% of the particles of the conducting phase having an average diameter smaller than 1 μm, and 20 to 35% of the conducting particles having an average diameter between 1 and 11 μm, and a distance between two adjacent particles of the conducting phase being between 30 Angström and 5 μm.

18 Claims, 1 Drawing Sheet

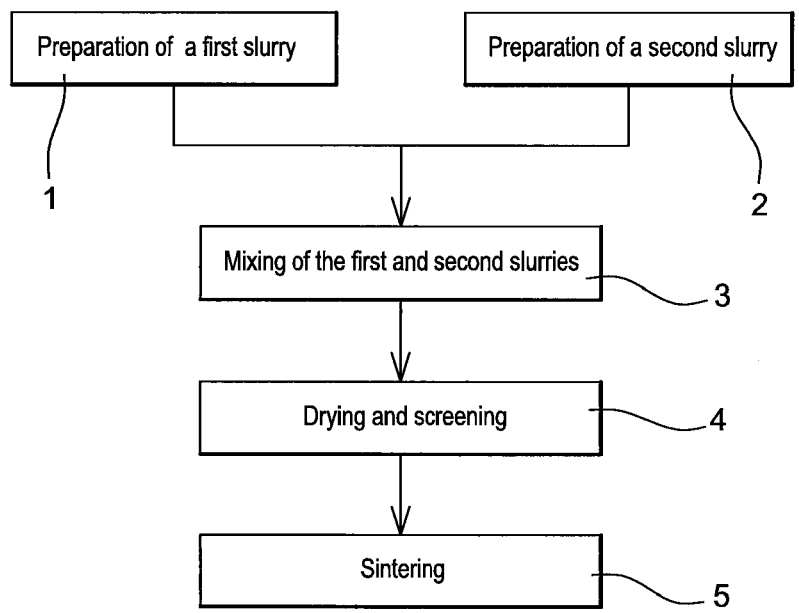

SEMICONDUCTOR CERAMIC

CROSS-REFERENCE TO RELATED APPLICATIONS

This is the U.S. National Stage of PCT/FR2009/051573, filed Aug. 7, 2009, which in turn claims priority to French Patent Application No. 0855483, filed Aug. 8, 2008, the entire contents of all applications are incorporated herein by reference in their entireties.

FIELD OF THE INVENTION

The present invention relates to the field of semiconductor ceramics and processes for manufacturing such semiconductor ceramics.

BACKGROUND OF THE INVENTION

Ignition systems for turbomachine engines use various technologies, and particularly ignition by spark plug, which is used for example to start gas turbines in aeronautics and industry.

In principal, turbomachines consist of three elements: the compressor, the combustion chamber, and the turbine.

The spark plug is situated inside the combustion chamber. This spark plug serves to transmit a quantity of energy delivered via a power supply, and creates a spark at one end thereof. This spark is caused by the breakdown of a gas-phase medium that surrounds two electrodes on the spark plug.

Two types of spark plug are currently in use: high voltage spark plugs (20 kV, a starting voltage which rises significantly under high pressures) inside the combustion chamber, and low voltage spark plugs including a semiconductor ceramic set between the two electrodes of the spark plug that cause the gas-phase medium to ionize and separating them regardless of the pressure inside the combustion chamber.

The advantage of spark plugs that include a semiconductor ceramic is that the voltage required to produce the spark is constant and unaffected by pressure.

The spark plugs must be able to withstand extreme operating conditions, particularly when they are used in aeronautical applications.

During operation, spark plugs containing a semiconductor ceramic are exposed to a number of different stresses.

One of these stresses is related to the strong thermal shocks that the spark plug must withstand due to the extremely rapid temperature rise inside the chamber (from 0° C. to 900° C. in one minute).

Another stress is related to the transition from an atmosphere that is very rich, and thus highly reductive, during take-off, to an atmosphere that is very lean, and thus highly oxidising, during flight.

Other stresses are related to the vibration of the engine, saline mist, humidity, and even freezing.

Thus it is in these extreme conditions that an electrical arc must be sustained between the two electrodes of the spark plug to enable the fuel to be ignited or reignited inside the combustion chamber.

The semiconductor ceramic material in modern spark plugs consists of two phases in the following proportions: 40% Sialon and 60% SiC. The ceramic in this type of spark plug has a high porosity, in the order of 15%. This porosity is distributed over the internal and external surfaces and extends to a depth of about a quarter of the thickness on each ceramic face. The pores are the sites of micro-discharges which enable the gas-phase media to be broken down in these microcavities.

SiC is a semiconductor with a wide bandgap and a large breakdown field (2 MV·cm−1) combined with good thermal conductivity, which renders it a material of choice for dissipating strong electric forces.

For its part, Sialon manifests good resistance to high temperature. It is a hard, wear-resistant material. It is chemically inert and unaffected by thermal shocks, it also has a low coefficient of expansion and is resistant to oxidation.

However, the main drawback associated with spark plugs that include a semiconductor ceramic as described above consists in their short service life and poor reliability.

Indeed, the semiconductor material is degraded quickly by the combination of extreme thermal shocks, maximum temperatures that are becoming higher and higher, and the oxidising atmosphere.

SiC is oxidised at temperatures above 600° C., which distorts the electrical properties of the material and significantly impairs its electrical conductivity.

The porosity of the ceramic renders it weaker and makes it more susceptible to premature wear.

At the same time, efforts to improve the output of thermal engines and reduce the emission of pollutants that such engines discharge into the atmosphere necessitate further increasing the temperature inside the combustion chambers.

As the temperature and pressure conditions in the combustion chambers are becoming more and more extreme, spark plugs that contain semiconductor ceramic according to the current state of the art are becoming unusable, and are thus reaching the limit of the technological capabilities.

One object of the present invention is to suggest a new semiconductor ceramic that serves to mitigate the disadvantages of SiC— and Sialon-based semiconductor ceramics.

BRIEF DESCRIPTION OF THE INVENTION

To this end, a semiconductor ceramic is provided, characterized in that it consists of:
  5 to 40% by volume of a particulate (electrically) conducting phase,
  60 to 95% by volume of a particulate (electrically) insulating phase, the size of the particles of the conducting phase being between 5 nm and 11 μm, and the distance between two adjacent particles in the conducting phase being between 30 Angström and 5 μm.

In this manner, a ceramic is obtained that behaves as a total electrical insulator up to a certain threshold of applied voltage, and as an electrical conductor with no (or very little) leakage current above the threshold.

It should be noted that one advantage of the invention consists in that the transition from an electrically insulating state to an electrically conductive state of the ceramic is obtained for a given fixed composition, unlike the classic percolation situation in which the transition from an electrically insulating state to an electrically conductive state is obtained when a further proportion of an electrically conducting phase is added. Thus, in the case of the present invention, the transition of the ceramic from an insulating state to a conductive state is obtained for a given fixed composition (due to remote percolation caused by the tunnel effect as described in greater detail in the following).

Advantageously, 65 to 80% of the particles of the conducting phase have an average diameter smaller than 1 μm. Preferably, 19.5 to 24% of the particles of the conducting phase have a diameter smaller than 240 nm. More preferably, 3.9 to 4.8% of the particles of the conducting phase have a diameter from 5 to 50 nm, 7.8 to 9.6% of the particles of the conducting phase have a diameter from 50 to 170 nm, and 7.8 to 9.6% of the particles of the conducting phase have a diameter from 170 to 240 nm.

Moreover, 20 to 35% of the particles of the conducting phase have an average diameter between 1 and 11 μm. Of this 20 to 35%, between 80% and 95% has a diameter smaller than 3 μm.

This results in a ceramic that still behaves as an insulator up to a certain applied voltage threshold and then becomes conductive with no leakage current (or very little).

For the purposes of the present invention, the phrase "average particle diameter" is understood to mean the average of the diameters obtained by considering the circles having the same area as the apparent surface of the particle when viewed from several angles.

Such a microstructure enables conduction by the tunnel effect and the "barrier effect".

In fact, in this case percolation is not enabled by contact between the conductive particles, the properties of the Inclusion/Matrix interface are used, this being a new phase whose electrical properties are modified.

The percolation threshold then corresponds to the volume fraction of conducting phase such that the inter-particle distances enable the electrons to jump from one particle to another, crossing the insulation barrier.

With an interface having a thickness of 30 Å to 5 nm, a tunnel effect conduction type is achieved, the current being unaffected by temperature under these conditions.

The ceramic begins conducting, the Joule effect appears and, with an interface thickness greater than 5 nm, the Schottky effect (as well as "hopping" (or variable distance jumping) and the Poole-Frenkel effect though to a lesser degree), activated thermally by the self-heating of the ceramic, enables a conduction current. The field effect and the space charge also encourage conduction.

The ceramic heats up, since thermal conduction is more effective than thermal radiation, conduction does not depend on temperature.

The insulating particles that constitute the interfaces between the conducting particles must also have specific properties, in particular a limited size, to make this conduction possible.

The conduction threshold may thus be defined by the distribution of the conductive particles, or more precisely by the distance between them.

In this way, a semiconductor ceramic is created whose conduction threshold is adjustable according to the arrangement of its particles.

Below this threshold, the ceramic is completely insulating, there is practically no leakage current.

For the purposes of the present invention, the phrase "size of the particles" is understood to mean the average diameter of the particles.

Preferred but non-limiting features of the invention are as follows:
- the material that constitutes the conducting phase is selected from the group consisting of $MoSi_2$, $TiB_2$, TiN, $Ni_3Si$, $HfB_2$, $ZrB_2$;
- the size of the particles in the insulating phase is between 0.3 and 3 μm;
- the material that constitutes the insulating phase is selected from $Al_2O_3$, mullite, $Si_3N_4$;
- the ceramic may include 15 to 25% by volume $MoSi_2$, and preferably 21 to 24% by volume $MoSi_2$;
- the ceramic may have a porosity less than or equal to 10% and preferably less than 5%;
- the conducting phase with a base of $MoSi_2$ particles may further include between 0% and 2% by weight of carbon;
- the surface of the semiconductor ceramic may be vitrified;
- the conducting phase with a base of $MoSi_2$ particles may further include 1% by weight of an element selected from Al, Ta, Ti, Zr, Y and B;
- the ceramic may further include 0.1 to 0.9% by weight of a lanthanide compound.

The invention further relates to a process for manufacturing a semiconductor ceramic of the type described above, which process includes the following steps:
- preparing a uniform suspension of a particulate conducting phase to obtain a first ceramic slurry,
- preparing a uniform suspension of a particulate insulating phase to obtain a second ceramic slurry,
- mixing the first and second ceramic slurries to obtain a mixture of the two phases, the first ceramic slurry constituting 5 to 40% by volume of the mixture and the second ceramic slurry constituting 60 to 95% by volume of the mixture,
- sintering the compound to obtain a ceramic in which the size of the particles of the conducting phase is between 5 nm and 10 μm, and the distance between two adjacent particles of the conducting phase is between 0.1 and 10 μm.

The sintering process may advantageously be chosen from natural sintering, hot pressing, and spark plasma sintering (SPS).

The invention further relates to a spark plug of the high energy low voltage type, in which the spark plug includes a semiconductor ceramic such as is described in the preceding between the electrodes thereof.

BRIEF DESCRIPTION OF THE DRAWING

Other characteristics, objectives and advantages of the present invention will be evident from the following description, which is purely illustrative and non-limiting in nature, and must be read with reference to FIG. 1, which represents the stages of the process for manufacturing the ceramic according to the invention.

DETAILED DESCRIPTION OF THE INVENTION

A semiconductor ceramic consists of an insulating phase and a conducting phase.

The mechanism of operation of modern Sialon- and SiC-based semiconductor ceramics relies on the intrinsic properties of one of the constituents of the ceramic (surface conduction of the SiC in conjunction with an open porosity).

At the same time, those semiconductors that may be eligible for use on the basis of their electrical characteristics (GaN, ZnO, and similar) must be discounted because of their low resistance to oxidation.

One solution is therefore to use a conducting phase included in an insulating matrix. This enables production of a material that is globally semiconductive and has a microstructure of the same type as the Sialon- and SiC-based semiconductor ceramics (grain boundaries, defects and similar) with optimal thermomechanical properties.

Accordingly, the starting process no longer depends on the intrinsic properties of one of the constituents and the surface microstructure, but on the overall nature of the material.

In order to ensure that the charges injected are not transported throughout the volume of the ceramic, it is necessary to implant the charges at a speed greater than the speed of conduction reflected by the relaxation time, which characterizes the return to equilibrium after the field is interrupted.

In the presence of conductive grains surrounded by interfaces with insulating grains, the charges are trapped on the surface of the grains, thus inducing a curve in the valence and conduction bands and forming a double Schottky barrier. In fact, the grain interfaces may be likened to two Schottky diodes situated back-to-back. Since the trapping induces a spatial charge, a field gradient is created followed by a relaxation of this spatial charge, the spatial charge depending on the transit time of the carriers and the thickness of the insulator. The thicker the insulator, the longer the relaxation time and the higher the "breakdown" voltage (in terms of conduction).

Conduction in the ceramic according to the invention is controlled by several mechanisms:

firstly, at the interfaces of the ceramic: the Schottky emission (the increase in the electron emission when the electrical field applied is increased is due to the reduced extraction effort), which determines the quality of the injection and is strongly correlated with the quality of the contacts and the field emission;

secondly, in the ceramic mass: the Poole-Frenkel effect (trapping/detrapping) and the hopping effect (conduction by jumping).

The Fowler-Nordheim tunnel effect and the spatial charge also contribute to conduction both at the interfaces and in the mass.

Accordingly, the limitation is now borne by the material's ability to withstand harsh environmental stresses.

Materials that may be considered for the conducting phase may be GaN, $MoSi_2$, $HfB_2$, $TiB_2$, $ZrB_2$, or even TiN.

Certain properties of these materials are listed in the following table:

| | GaN | MoSi2 | HfB2 | TiB2 | ZrB2 | TiN |
|---|---|---|---|---|---|---|
| Vickers hardness (MPa)/MOHS | 1 | 8700-9200 | | 3000 | 2300 | 2300 |
| Thermal conductivity (Wm-1K-1) | 1.3 | 90 | | | | |
| Coefficient of thermal expansion (10-6 K-1) | 3.17 | 6.8 | 5-7 | 7.8 | 5.9 | 8-8.5 |
| Resistivity (ohm cm) | 2. 10-6 | 2.2 10-5 | 10-5 | 7. 10-6 | 6. 10-6 | 50. 10-6 |
| Fusion temperature ° C. | 2500 | 2020 | 3380 | 3225 | 3245 | 2950 |

Molybdenum disilicide ($MoSi_2$) seems to be an advantageous material for producing the conducting phase not only because of its intrinsic qualities but also because of its ability to resist oxidation.

The advantages of using a $MoSi_2$ base for the conducting phase are that $MoSi_2$ has a high fusion temperature (2030° C.), $MoSi_2$ is highly resistant to oxidation up to 1600° C., $MoSi_2$ is highly conductive of heat, 50 WMK, and $MoSi_2$ is thermodynamically stable.

When two phases with different electrical conductivities are mixed, the resulting compound is likely to have a very large range of conductivity values. The conductive grains of $MoSi_2$ act as connections between capacitances the dielectric of which is formed by $Al_2O_3$.

Close to the critical region, only a few percolating beam paths remain, and the condensers have become extremely important.

With a microstructure including large "clusters" of alumina, which are the condensers that control the mechanism of conduction, and whose volume is too large to allow charges to pass via the tunnel effect, the charges remain trapped in the alumina and conduction remains very limited.

Conversely, when the conductive particles are small, and in particular well distributed, the percolation threshold is lowered and conduction is instantaneous as soon as a voltage is applied, since the inter-particle distance has been reduced significantly.

Two microstructures having the same composition may thus exhibit completely different behaviours depending on the arrangement of the two phases, so it is necessary to reach a compromise between the two extremes, one in which the $MoSi_2$ grains percolate, and the other in which they are not in contact with each other.

Accordingly, the microstructure according to the invention is a uniform distribution of the $MoSi_2$ particles within the alumina matrix (particle is understood to mean the grain or cluster of grains from 15 nm to 5 μm) in order to enable the charges to be passed via the tunnel effect, to compensate for the extraction of excessively large $MoSi_2$ particles, which would cause the process of conduction by remote percolation to break down, and to obtain satisfactory mechanical properties.

The existence of a "gradient of conductive particle sizes" within the insulating matrix enables the expected overall electrical effect (totally insulating behaviour followed by conductive behaviour of the material) to be achieved. The particle size distribution is organized for example according to the following scheme:

"small particles": average diameter less than 240 nm (19.5 to 24% of the particles in the conducting phase);

"medium size particles": average diameter from 240 nm to 1 μm (45.5 to 56% of the particles in the conducting phase);

"large particles": average diameter from 1 μm to 11 μm (20 to 35% of the particles in the conducting phase).

To avoid obtaining a material that is conductive as soon as a voltage is applied, the transport of charges for the same conductor/insulator ratio must be limited (no contact, no uniformly small inter-particle distances); this is why this particle size gradient is important.

In order to delay conduction, a small number of large particles arranged relatively distant from each other are used.

The probability of transfer via the tunnel effect decreases as the inter-particle distance increases; when large particles are used, it is necessary to compensate for these distances using defects in the inter-particle zone or with the presence of small particles that enable conduction, still without contact but via the tunnel effect, which is facilitated by the smaller inter-particle distances.

The average particles are useful as "intermediaries", they enable conduction once it has been established (and they can function either as large particles or as small particles depending on their location) and serve to homogenise the material. Accordingly, the expected microstructure is of both the grains and the grain clusters of $MoSi_2$ (of controlled sizes), distributed evenly in the matrix.

It should be noted that when the alumina grains are smaller, the number of grain interfaces becomes larger, which in turn increases the number of trapping regions, and increases conduction; accordingly, the size of the alumina grains is also a factor that must be controlled.

It is therefore suggested to produce a semiconductor ceramic consisting of:

5 to 40% by volume of a particulate conducting phase, preferably with a MoSi$_2$ particle base, 60 to 95% by volume of a particulate insulating phase, the size of the particles in the conducting phase being between 5 nm and 10 μm, and the distance between two adjacent particles in the conductive phase being between 0.1 and 10 μm.

It is suggested preferably to produce a semiconductor ceramic consisting of:

10 to 30% by volume of conductive phase having a base of MoSi$_2$ particles, 70 to 90% by volume of a particulate insulating phase, the size of the MoSi$_2$ particles being between 15 nm and 5 μm, and the distance between two adjacent MoSi$_2$ particles being between 0.1 and 6 μm.

For the purposes of the present invention, the term "particle" is understood to mean a grain or an aggregate/cluster of grains.

The method used to measure the size of the MoSi$_2$ particles includes observing the brittle fractures of broken samples with a scanning electron microscope. The images are then reprocessed using the ESIVISION AnalySIS 3.2 software. This yields the average diameter of the MoSi$_2$ particle.

The semiconductor ceramic may advantageously include 15 to 25% by volume MoSi$_2$, and preferably 21 to 24% by volume MoSi$_2$.

One advantage of this ratio is that it produces a ceramic that is particularly suitable for use as the material for a low voltage spark plug.

For the purposes of the present invention, a "conductive phase having a MoSi$_2$ particle base" is understood to be constituted essentially of such particles. However, it may also include other constituents such as carbon, boron, or various metals.

The conductive phase according to the invention preferably includes more than 90% of MoSi$_2$ particles, more preferably more than 95%, and yet more preferably more than 97% of MoSi$_2$.

In a variant embodiment of the ceramic according to the invention, the MoSi$_2$ conducting phase includes between 0.1% and 3% by mass (of the total mass of the insulating phase+conducting phase) of a simple element (C, B, or similar) or a rare earth.

One advantage of introducing carbon (boron or rare earth) is that it improves the mechanical properties of the MoSi$_2$ conducting phase.

The insulating phase may be produced on the base of Al2O3, SiN4, mullite (2 SiO2, 3 Al2O3), or also of ALON.

Certain properties of these materials are listed in the following table:

|  | Al2O3 | Si3N4 | Mullite* (Al$_6$Si$_2$O$_{13}$) | ALON |
|---|---|---|---|---|
| Mohs/Vickers hardness (MPa) | 9 | 1580 |  | 7.5 |
| Thermal conductivity (Wm−1K−1) | 26-35 | 15-43 | 3-5 | 2.5 |
| Coefficient of thermal expansion (10−6 K−1) | 6.7-9 | 3 | 5-6 | 2-3 |
| Resistivity (ohm cm) | 1014 | 1012-1015 | 1010-1013 | 1011-1014 |
| Fusion temperature ° C. | 2050 | 1900 | 1880 | 1470 |

In one embodiment of the ceramic according to the invention, the insulating phase of the ceramic is produced on a base of Si3N4.

In fact, this material exhibits greater hardness, greater thermal conductivity, and greater resistivity than Al2O3, mullite and ALON.

In another embodiment of the ceramic according to the invention, the insulating phase of the ceramic is produced on a base of Al$_2$O$_3$.

In fact, alumina (Al$_2$O$_3$) exhibits high electrical resistivity, excellent creep resistance at temperatures above 1400° C., and good resistance to aggressive chemicals. Moreover, one advantage of a composite of MoSi$_2$ and Al$_2$O$_3$ for the conducting and insulating phases of the ceramic is that these two materials have similar coefficients of expansion, so that thermal stresses between the two materials are reduced.

The size of the particles of the insulating phase may advantageously be between 0.3 and 3 μm.

The method used to measure the size of the insulating phase particles includes observing the brittle fractures of broken samples with a scanning electron microscope. The images are then reprocessed using the ESIVISION AnalySIS 3.2 software. This yields the average diameter of the insulating phase particles.

The semiconductor ceramic according to the invention has an average porosity of less than or equal to 10%, preferably less than 5%. This porosity value is a function of the technique used to manufacture the ceramic. For example, if the ceramic is fabricated by natural sintering, the average porosity will be less than or equal to 10%. If "hot press" (HP) sintering is used, the average porosity of the ceramic will be less than or equal to 2%. Finally, if the "spark plasma sintering" (SPS) process is used, the average porosity of the ceramic will be less than or equal to 3%. All of these sintering techniques will be described in greater detail in the following.

Unlike the Sialon- and SiC-based ceramics of the prior art, which require open porosities (together with the surface conducting property of SiC) in order to function properly, the mechanism of function (that is to say the initiation process) of the ceramic according to the invention depends on the overall nature of the material. The breakdown of the space surrounding the electrodes is assured by conduction of surface charges that is induced by a skin development provided by a high frequency signal.

Thus, the mechanism of function of the ceramic according to the invention does not require the presence of open porosities.

However, against the event that the ceramic does include open porosities, the surface of the semiconductor ceramic may be vitrified. In this way, it is possible to minimise the phenomenon referred to as "Pest", which can cause the semiconductor ceramic to disintegrate. The strength of the semiconductor ceramic may thus be improved by surface vitrification.

According to one variant that is designed to minimise the Pest phenomenon, the MoSi$_2$ conducting phase may include 1% by weight of an element selected from Al, Ta, Ti, Zr, Y and B.

The semiconductor ceramic according to the invention may advantageously include 0.1 to 0.9% by weight of a lanthanide compound as well (for example La2O3, or La2B6). A lanthanide (La2O3, LaB6) is a material that encourages electron emission. Thus, adding a small quantity to the semiconductor ceramic serves to reinforce the thermoemission of the semiconductor ceramic.

In the following, a process for fabricating the semiconductor ceramic according to the invention will be described.

In order to resolve the problems of reliability over time of electrically conductive ceramics, it is necessary to find a way to prepare the material under optimal conditions, and control its microstructure so as to obtain the desired properties.

The electrical characteristics depend on the percentage by volume of the conductive phase, and on the type of microstructure that is developed after sintering.

The preparation process whose major parameters condition the microstructure and thus also the physical characteristics of the sintered samples is in fact the prime phase.

These parameters relate primarily to:
the nature of the powders
the proportions of the insulating and conducting phases
the quantity and composition of the additives
the deagglomeration processes
the shaping technique
the sintering conditions.

The process for fabricating a semiconductor ceramic includes the following steps:
preparation 1 of a uniform suspension of a conducting phase, for example based on $MoSi_2$ particles to obtain a first slurry,
preparation 2 of a uniform suspension of a particulate insulating phase to obtain a second slurry,
mixing 3 of the first and second slurries to obtain a mixture of the two phases in the desired proportions (that is to say with the first slurry representing 5 to 40% by volume of the mixture and the second slurry representing 60 to 95% by volume of the mixture),
drying and screening 4 of the composition;
sintering 5 of the composition to obtain a ceramic in which the size of the conducting phase particles is between 5 nm and 10 μm, and the distance between two adjacent particles of the conducting phase is between 30 Å and 5 μm.

As was described previously, the conducting phase may be selected from the group consisting of MoSi2, $TiB_2$, TiN.

Moreover, the insulating phase may have a base of alumina, $Al_2O_3$ or mullite, Si3N4.

To prepare the first slurry, the conducting phase of $MoSi_2$ is mixed with water having a pH between 8 and 10.

This enables the uniformity of the microstructure to be improved.

To prepare the second slurry, the insulating phase is mixed with water having a pH equal to 10 and containing a dispersant, advantageously a surfactant polymer of the ammonium polymethacrylate type such as DARVAN C, marketed by VANDERBILT. This dispersant helps to prevent the alumina $Al_2O_3$ particles from clumping. It is advantageously introduced in a quantity of 0.1% by weight.

The two slurries are then mixed to obtain a mixture of the two phases. The intimate mixture of the 2 slurries is carried out using a rotary jar or ball mill. Crushing is carried out for a period between 5 and 24 hours. The mixture is then dried in an oven for 48 hours. To avoid differential sedimentation of the two particle types, a rapid drying method offered by ROTOVAP may be implemented.

The powder obtained in this way is crushed in a mortar; then placed with glass beads (diameter 10 mm) in a sieve with mesh size of 250 μm of an electric sieving machine, the powder that passes through the 250 μm mesh is deposited in a sieve having a mesh size of 100 μm and containing alumina beads (diameter 3 mm).

The roughly ground composite powder thus collected is ready for shaping, after which it is sintered.

The shaping step is optional. The implementation method depends on the sintering technology used. The shaping step transforms the material into a green body product having the desired size, shape and controlled surface as well as the desired density and particulate microstructure.

The density and microstructure of a green body ceramic product must be controlled very carefully in order to obtain the desired performance of the finished product, since defects introduced by the shaping process cannot generally be eliminated during sintering.

A smooth, regular surface is generally desirable and may be essential for certain products. Resistance must be sufficient to enable certain operations to be carried out after shaping. The reproducibility of the product is very important for industrial production. The size and density of the green body item must be controlled to ensure that a constant shrinkage factor is maintained between the green body item and the sintered item.

For the shaping step, compaction or dry compaction technology may be used.

Compaction is a method for shaping powders or granulated materials enclosed in a rigid or flexible mould.

Dry compaction is a method that is widely used because it has good reproducibility and lends itself well to producing large items and products of various shapes that do not manifest any drying shrinkage. It includes the following steps:
(1) filling the mould;
(2) compacting and shaping;
(3) demoulding the item;
(4) densification.

The composition is then sintered. Unlike ceramic firing, in principle sintering does not cause particles to be bonded by a vitreous phase. The coherence and densification of the pressed powders are brought about by transformations that affect the surface of the particles and create solid-solid interfaces called grain boundaries.

The sintering conditions determine the microstructure and thus also the properties of the final material.

A number of different technologies may advantageously be used for sintering the composition. For example, in one embodiment of the process, sintering is carried out by natural sintering. In another embodiment, sintering is performed by hot press sintering. In yet another embodiment, spark plasma sintering (SPS) is used.

In order to carry out hot press sintering, the pressing oven used is of the Goliath type (Stein Heurtey Physitherm) that combines a press (maximum load 20 tons) and a graphite resistance oven (maximum temperature 2200° C.), which can only function in an inert atmosphere or with a high vacuum.

The temperature is controlled by a tungsten/rhenium 5/26% thermocouple located close to the resistor and by a bichromatic pyrometer (IRCON) which measures the actual temperature on the surface of the equipment.

With hot press (HP) sintering, it is possible to obtain 37 mm pellets. These pellets do not require any further shaping.

Optimal densification of the ceramic is obtained at a temperature between 1600° C. and 1700° C. (and preferably equal to 1650° C.) and with a charge of 45 MPa.

The temperature at which the best compromise may be reached between densification and microstructure favourable for the expected electrical behaviour is 1500° C.

In a natural sintering process, the same oven is used as for hot press sintering. The only difference in this case is that the samples are placed in a graphite crucible after shaping, and are not subjected to a load during sintering.

In order to limit the exchange of gases with the outside, the preformed pellets are placed in an alumina crucible for "shell firing", that is to say coating the pellets with uncompacted powder of the same kind so as to avoid any contact with the oven atmosphere.

It is also possible to use the spark plasma sintering (SPS) method for sintering as described above. With spark plasma sintering (SPS), it is possible to densify the materials without losing the initial characteristics of the powders, and to densify difficult materials.

Spark plasma sintering (SPS) is a similar process to conventional hot pressing. The precursors (metals, ceramics, polymers and their composites, and suchlike) are introduced into a (graphite) enclosure that allows uniaxial pressure to be applied during sintering.

The main difference in this process consists in the fact that the heat source is not external. An electric current (direct—pulsed direct—or alternating) is passed through the conductive pressing enclosure, and in appropriate cases through the sample.

In this way, the enclosure itself functions as the heating source, which enables high heating rates (as much as 600° C./min and more) to be achieved, enabling good transfer of the heat to the sample. It is possible to obtain highly compacted sintered objects at lower temperatures (several hundred degrees cooler), and most importantly with significantly shorter sintering times (several minutes) than with conventional methods. Spark plasma sintering (SPS) is an extremely promising technique for the purposes of improving the shaping of materials that are currently being used.

Densification is enhanced by the use of a current or a pulsed field.

The reader will have realised that many modifications may be made to the semiconductor ceramic and to the manufacturing process therefor described in the preceding without substantially departing from the new teaching and advantages described here.

Accordingly, all modifications of such kind are intended for inclusion in the scope of the ceramic and manufacturing process therefor as defined in the attached claims.

Moreover, while the ceramic according to the invention is particularly well suited for use in the field of spark plugs for turbomachinery in the aeronautics industry, still other applications are also conceivable (production of varistors, for example).

The invention claimed is:

1. A semiconductor ceramic comprising a microstructure comprising:
   5 to 40% by volume of a particulate conducting phase wherein the material constituting the conducting phase is selected from the group consisting of $MoSi_2$, TiN, $Ni_3Si$, $HfB_2$, and $ZrB_2$; and
   60 to 95% by volume of a particulate insulating phase,
   a size of the particles of the conducting phase being between 5 nm and 11 μm, 65 to 80% of the particles of the conducting phase having an average diameter smaller than 1 μm, and 20 to 35% of the conducting particles having an average diameter between 1 and 11 μm, and a distance between two adjacent particles of the conducting phase being between 30 Angström and 5 μm.

2. The semiconductor ceramic as recited in claim 1, wherein the size of the particles in the insulating phase is between 0.3 and 3 μm.

3. The semiconductor ceramic as recited in claim 1, wherein the material constituting the insulating phase is selected from $Al_2O_3$, mullite, and $Si_3N_4$.

4. The semiconductor ceramic as recited in claim 1, comprising 15 to 25% by volume $MoSi_2$.

5. The semiconductor ceramic as recited in claim 4, comprising 21 to 24% by volume $MoSi_2$.

6. The semiconductor ceramic as recited in claim 1, wherein the ceramic has a porosity less than or equal to 10%.

7. The semiconductor ceramic as recited in claim 6, wherein the ceramic has a porosity less than 5%.

8. The semiconductor ceramic as recited in claim 1, wherein the conducting phase based on $MoSi_2$ particles includes between 0% and 2% by weight of carbon.

9. The semiconductor ceramic as recited in claim 1, wherein a surface of the semiconductor ceramic is vitrified.

10. The semiconductor ceramic as recited in claim 1, wherein the conducting phase based on $MoSi_2$ particles includes 1% by weight of an element chosen from Al, Ta, Ti, Zr, Y and B.

11. The semiconductor ceramic as recited in claim 1, comprising 0.1 to 0.9% by weight of a lanthanide compound.

12. The semiconductor ceramic as recited in claim 1, wherein 19.5 to 24% of the particles of the conducting phase have an average diameter smaller than 240 nm.

13. A process for fabricating a semiconductor ceramic as recited in claim 1, the process comprising:
   preparing a uniform suspension of a particulate conducting phase based on $MoSi_2$ particles in order to obtain a first slurry;
   preparing a uniform suspension of a particulate insulating phase in order to obtain a second slurry;
   mixing the first and second slurries in order to obtain a mixture of the two
   phases, the first slurry representing 5 to 40% by volume of the mixture, and the
   second slurry representing 60 to 95% by volume of the mixture, and
   sintering the mixture to obtain a ceramic in which the size of the particles in the conducting phase is between 5 nm and 10 μm, and the distance between two adjacent particles in the conducting phase is between 0.1 and 5 μm.

14. The process as recited in claim 13, wherein the sintering is selected from natural sintering, hot press sintering, and spark plasma sintering (SPS).

15. A high energy low voltage spark plug, comprising electrodes and a semiconductor ceramic between the electrodes, wherein the semiconductor ceramic comprises a microstructure comprising
   5 to 40% by volume of a particulate conducting phase; and
   60 to 95% by volume of a particulate insulating phase,
   a size of the particles of the conducting phase being between 5 nm and 11 μm, 65 to 80% of the particles of the conducting phase having an average diameter smaller than 1 μm, and 20 to 35% of the conducting particles having an average diameter between 1 and 11 μm, and a distance between two adjacent particles of the conducting phase being between 30 Angström and 5 μm.

16. The spark plug as recited in claim 15, wherein the material constituting the conducting phase is selected from the group consisting of $MoSi_2$, $TiB_2$, TiN, $Ni_3Si$, $HfB_2$, $ZrB_2$.

17. The spark plug as recited in claim 15, wherein the size of the particles in the insulating phase is between 0.3 and 3 μm.

18. The spark plug as recited in claim 15, wherein the material constituting the insulating phase is selected from $Al_2O_3$, mullite, and $Si_3N_4$.

* * * * *